United States Patent
Kupershmidt et al.

(10) Patent No.: US 8,885,677 B1
(45) Date of Patent: Nov. 11, 2014

(54) SEMICONDUCTOR EXTERNAL CAVITY LASER WITH INTEGRATED PLANAR WAVEGUIDE BRAGG GRATING AND WIDE-BANDWIDTH FREQUENCY MODULATION

(71) Applicant: Redfern Integrated Optics, Inc., Santa Clara, CA (US)

(72) Inventors: Vladimir Kupershmidt, San Francisco, CA (US); Lew Stolpner, Mountain View, CA (US); Mazin Alalusi, Sunnyvale, CA (US); Steve Yiqiang Li, San Jose, CA (US)

(73) Assignee: Redfern Integrated Optics, Inc., Santa Clara, CA (US)

( * ) Notice: Subject to any disclaimer, the term of this patent is extended or adjusted under 35 U.S.C. 154(b) by 64 days.

(21) Appl. No.: 13/631,656

(22) Filed: Sep. 28, 2012

Related U.S. Application Data

(60) Provisional application No. 61/540,466, filed on Sep. 28, 2011.

(51) Int. Cl.
*H01S 3/10* (2006.01)
*H01S 5/10* (2006.01)

(52) U.S. Cl.
CPC ........................................ *H01S 5/10* (2013.01)
USPC .......................................................... 372/28

(58) Field of Classification Search
CPC ..... H01S 3/005; H01S 3/0085; H01S 3/0092; H01S 3/08036; H01S 3/0675; H01S 5/10
USPC .......... 372/28, 20, 29.2, 64, 92; 359/185, 330
See application file for complete search history.

(56) References Cited

U.S. PATENT DOCUMENTS

| | | | |
|---|---|---|---|
| 4,485,474 A | 11/1984 | Osterwalder | |
| 5,384,799 A | 1/1995 | Osterwalder | |
| 6,041,071 A | 3/2000 | Tayebati | |
| 2007/0286608 A1 | 12/2007 | Matsui et al. | |
| 2008/0240180 A1* | 10/2008 | Matsui et al. | 372/26 |
| 2010/0303121 A1* | 12/2010 | Alalusi et al. | 372/92 |
| 2011/0267676 A1* | 11/2011 | Dallesasse et al. | 359/279 |

OTHER PUBLICATIONS

Enscoe, R.F., and Kocka, R.J., "Electro-optic modulation: Systems and Applications." Accessories/Technical Data—Polytech, Inc.; 11 pgs.

* cited by examiner

*Primary Examiner* — Tuan Nguyen
(74) *Attorney, Agent, or Firm* — David H. Jaffer; Pillsbury Winthrop Shaw Pittman LLP

(57) ABSTRACT

The present disclosure describes semiconductor external cavity laser with wide bandwidth frequency modulation capabilities. The laser is preferably packaged in a standard form-factor package, such as a 14-pin butterfly package. The front end of the cavity comprises an integrated planar circuit (e.g., silica-on-silicon planar lightwave circuit with Bragg gratings), and the "back facet" of the laser is implemented as a high-reflection (HR) coated $LiNbO_3$ phase tuning section in the double pass configuration. AC-voltage signal applied to the electrodes of phase tuning section modulates a refractive index of the propagating TE-polarization mode of external cavity and produces frequency modulation. Such frequency modulation is not associated with any thermal behavior of the gain element included in the external cavity laser, and has a negligible phase delay over a wide bandwidth.

16 Claims, 6 Drawing Sheets

SEMICONDUCTOR EXTERNAL CAVITY LASER WITH INTEGRATED PLANAR WAVEGUIDE BRAGG GRATING AND WIDE-BANDWIDTH FREQUENCY MODULATION

CROSS-REFERENCE TO RELATED APPLICATIONS

This application claims priority from U.S. Provisional Patent Application Ser. No. 61/540,466 filed Sep. 28, 2011, which is incorporated herein by reference.

FIELD OF THE INVENTION

The present invention relates to narrow-linewidth external cavity lasers (ECL) with a wide-bandwidth (BW) intra-cavity frequency modulating section integrated into the design of the laser.

BACKGROUND

There are different known approaches to accomplish wavelength tuning and/or frequency modulation (FM) using an electro optical material such as lithium niobate (LiNbO3).

U.S. Pat. No. 5,384,799 describes a semiconductor gain element which is coupled to and frequency locked to surface acoustic modes generated by an acousto-optical transducer located at a front facet of a compound external cavity of a laser. Such frequency locking served only "internal" purposes to produce a highly coherent laser with narrow linewidth. As soon as laser is locked, "external" frequency modulation is not possible any more. Redfern Integrated Optics, Inc, based in Santa Clara, Calif., has developed semiconductor based external cavity lasers with integrated Silica-on-Si planar waveguide Bragg grating, commercially known as PLANEX. Such ECLs are high performance semiconductor laser sources which combines ultra-low frequency noise, and narrow linewidth (~2-3 kHz). US patent application publication 2010/0303121 describes an example of a PLANEX-type ECL. Frequency modulation in such lasers is accomplished via direct bias current modulation applied to a gain chip. This design also serves the purpose of implementing a highly coherent frequency stabilized laser.

U.S. Pat. No. 4,485,474 uses an external cavity semiconductor laser with intracavity LiNbO3 modulator and adjustable (i.e., movable) spherical mirror as an output coupler. This design is targeted for high frequency modulation of the order of hundred MHz and gives less importance to reducing coupling losses, uniform amplitude or phase FM response, and linewidth or frequency noise. This design is suitable for high frequency modulation laser source for RF communication.

U.S. Pat. No. 6,041,071 describes a 3-section external cavity widely tunable (over a C-band wavelength) distributed Bragg Reflector (DBR) laser with grating formed on the LiNbO3 waveguide. In this design a tunable mechanism helps to select desired mode in the external cavity formed by the DBR section. Such tunable mechanism is based on the application of an external electrical field in the LiNbO3 section, which changes index of refraction due to Bragg grating formed in this section. This design addresses slow but wide wavelength tuning over a C-band but fails to procure a high frequency modulation at a specified laser wavelength. It is well known in the art that DBR sections located in the external cavity typically cannot provide low frequency noise and a narrow linewidth (of the order of 10 kHz.) To achieve narrow linewidth and low frequency noise, the grating section needs to be separated from the modulated section.

US Patent application publication 2007/0286608 describes multi-section optical FM semiconductor source based on intra-cavity FM and AM modulation. Such a design targets optical communication systems with frequency shift keying having uniform amplitude of frequency modulation with frequency range from few MHz to 10 GHz and chirp management (reshaped filter functions). Frequency modulation in such a design is accomplished by modulating the electro-absorption loss of the laser cavity. Presence of the electro-absorption section creates large changes in the phase of the electro-absorption section and at the same time increases a linewidth up to MHz range.

As described above, the PLANEX-type lasers use a gain chip for direct frequency modulation. Due to the thermal time constants of the gain chip, FM is associated with large phase delay, which limits applications of direct current modulation FM approach, specifically where optical phase locking or frequency stabilization requires a wide bandwidth (BW).

None of the existing external cavity laser architectures with modulating FM section is able to simultaneously address target parameters essential for demanding applications, such as distributed interferometric sensing, optical frequency metrology and application requiring locking (such as, atomic clock, frequency reference source, laser gyro, tunable microwave source, optical phase lock loop (OPLL) etc.) The desired performance parameters include, but are not limited to:

Wide bandwidth of frequency modulation up to 100 MHz with absence of phase delay
Both uniform response of FM amplitude and phase
Narrow linewidth (below 10 kHz)
Ultra-low frequency noise of the order of frequency noise existing in fiber laser and PLANEX-type laser Requirements like the absence of a significant phase delay in DC to 100 MHz bandwidth (BW) present technological challenges for known distributed feedback (DFB), DBR and external cavity semiconductor lasers using direct modulation approach. The reasons for this is that in this frequency range there are two sources of frequency modulation, namely, thermal sources and electronic (adiabatic) sources. Accordingly interplay between two mechanisms results in phase reversal at a frequency window where phase of frequency modulation is close to 180 degree. In DFB, DBR lasers such phase reversal frequency is located between 500 kHz and tens of MHz, depending on thermal constants, while in the external cavity semiconductor lasers such phase reversal frequency is around 50-200 kHz depending on the length of the cavity. Another example known in the art are a fiber lasers with narrow linewidth which accomplishes frequency modulation via piezoelectric transducer (PZT) tuning of Bragg grating. This design has very limited frequency modulation bandwidth in the order of 10-50 kHz.

Accordingly, it is necessary to implement an architecture of semiconductor ECL that achieves all or most of the desired performance parameters while being compact, consuming low power, and being easy to manufacture and package. Co-owned US patent application no. US 2010/0303121 by Alalusi et al., incorporated by reference herein in its entirety, describes a semiconductor ECL device with narrow linewidth and low noise comprising a planar lightwave circuit (PLC) and a gain chip butt coupled to each other, where a high-reflection (HR)-coated back facet of the semiconductor gain chip defined the length of the external cavity. In the present invention, a lithium niobate phase tuning element with a HR-coated back facet forms part of the external cavity, offering superior frequency modulation characteristics, as described in detail below.

SUMMARY OF THE INVENTION

The present invention describes narrow-linewidth semiconductor external cavity laser (ECL) with integrated wide bandwidth (BW) intracavity frequency modulation (FM) section. The laser is preferably packaged in a standard form-factor package, such as a 14-pin butterfly package. The front end of the cavity comprises an integrated planar circuit (e.g., silica-on-silicon planar lightwave circuit with Bragg gratings), and the "back facet" of the laser is implemented as a high-reflection (HR) coated lithium niobate ($LiNbO_3$) phase tuning section in the double pass configuration. AC-voltage signal applied to the electrodes of the phase tuning section modulates a refractive index of the propagating tranverse electric (TE)-polarization mode of the external cavity and produces frequency modulation. Such frequency modulation is not associated with any thermal behavior of a gain element included in the external cavity laser, and has a negligible phase delay over a wide bandwidth. Purposes of the present invention include extending frequency modulation over a wide bandwidth with negligible phase delay, and at the same time, maintaining narrow-linewidth and frequency noise performance of the PLANEX-type laser.

The invention itself, together with further objects and advantages, can be better understood by reference to the following detailed description and the accompanying drawings.

BRIEF DESCRIPTION OF THE DRAWINGS

Embodiments of the invention will now be described, by way of example only, with reference to the accompanying schematic drawings in which corresponding reference symbols indicate corresponding parts, and in which.

Persons skilled in the art will be able to appreciate the above features and the other aspects of the present invention in view of the detailed description and drawings.

DETAILED DESCRIPTION OF EXAMPLE EMBODIMENTS

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

The present invention uses planar Bragg gratings (PBG) on planar lightwave circuit (PLC) platform. PLC can also be referred to as planar waveguide circuit (PWC). PLC platform may be implemented on a standard silica-on-silicon material system, or other material systems. This cavity structure of an ECL implemented on PLC offers a significant reduction in vibration sensitivity over other ECL designs. Furthermore, PBG offers the advantage of high single polarization selectivity by appropriate design.

Figure 1:
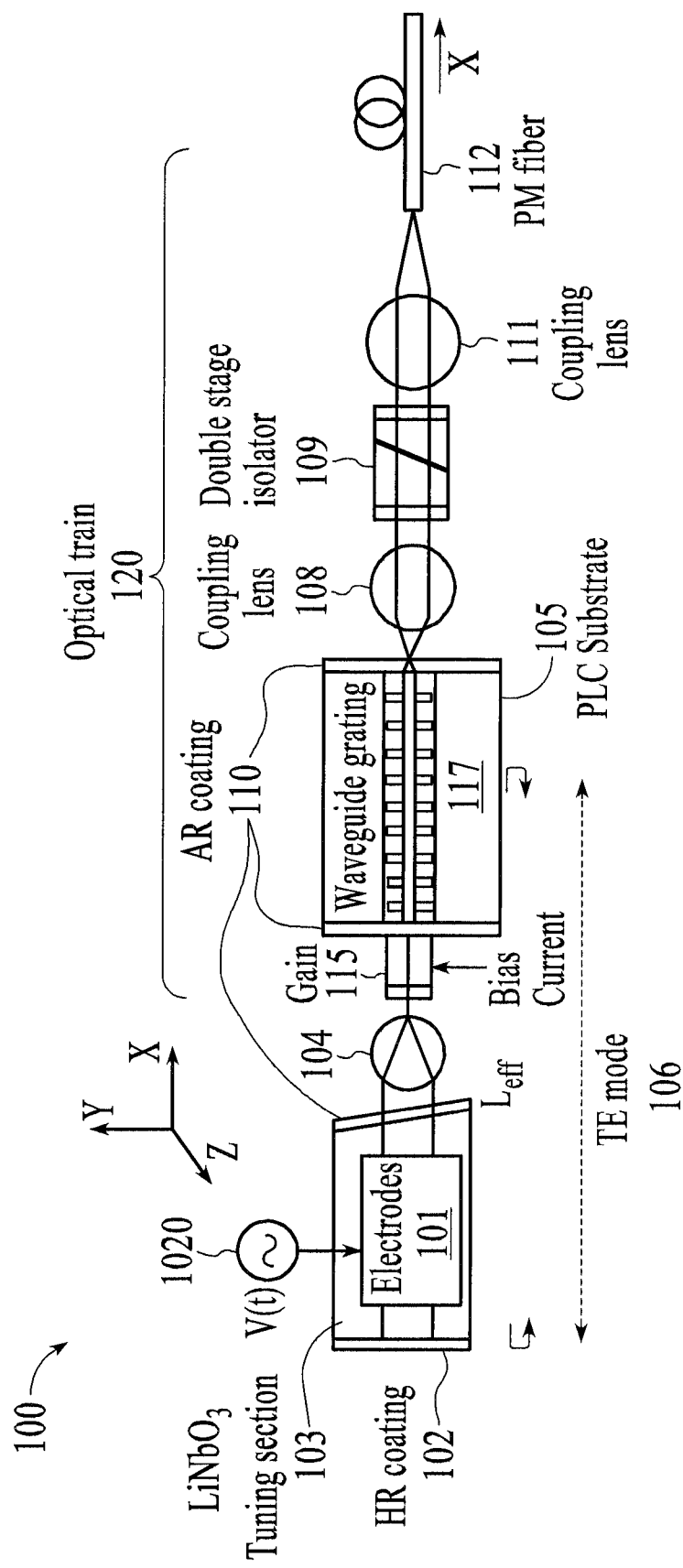
FIG. 1 illustrates a first embodiment of the present invention showing a semiconductor laser's external cavity's optical train along the propagation beam direction and PLC front end.

FIG. 1 shows a first embodiment of the present invention. This embodiment provides an external cavity arrangement having frequency modulation with uniform frequency response and wide bandwidth (up to 100 MHz), and at the same time, maintains desirable properties, such as narrow linewidth and low frequency noise.

To meet such requirements, this embodiment uses a hybrid architecture of the external cavity where a high reflectivity back facet is formed by a $LiNbO_3$ bulk crystal in double pass configuration, and an antireflection (AR)-coated semiconductor gain element coupled to the back face through a micro lens (ball or aspheric types).

The front end of the external cavity, similar to what is described in US2010/0303121, is formed by a gain element butt-coupled to the dispersive Bragg grating formed in polarization maintaining PLC waveguide. Such front end of the external cavity maintains all essential elements of PLANEX-type design which combines integration of the semiconductor gain chip with Silica-on-Si Planar PLC with asymmetric, high reflectivity waveguide grating.

Frequency modulation of the hybrid external cavity is achieved by the application of the AC-voltage signal to the electrodes of LiNbO3 element such that it generates an electrical field parallel (transverse configuration) to the direction of TE-mode circulating in the external cavity. The invention uses as an advantage a known fact that semiconductor gain element acts as a polarizer which partially transmits (e.g., at ~100:1 ratio) only TE-mode aligned to the direction of applied electrical field in the LiNbO3 element. Such induced electrical filed changes a refractive index in the $LiNbO_3$ element and correspondingly optical path of circulating TE-mode which results in a frequency modulation in the external cavity. Modulation of LiNbO3 chip allows to overcome thermal limitations associated with bias current modulation approach and to achieve a wide and uniform phase modulation bandwidth.

A second embodiment of the invention provides an external cavity laser with low voltage requirements to produce frequency modulation with uniform amplitude and phase response. Such an external cavity use a PLANEX-type optical architecture as the front end while the back facet of such cavity is implemented by a $LiNbO_3$ waveguide in double pass configuration, as shown in the configuration in FIG. 2. To achieve requirements for low applied voltage, embodiments of the present invention utilize $LiNbO_3$ mirror in the form of X-cut crystal orientation waveguide located between two pairs of deposited electrodes. A first pair of RF electrodes is used for frequency modulation. A second pair of electrodes is used as DC-bias electrodes and enables fine DC-adjustment of the phase of an external cavity independently of bias current of Fabry-Perot (FP) chip without inducing any thermal effect, as the current is low.

In the above embodiment, the waveguide is located between the electrodes and utilizes the orientation of propagating TE-polarization mode (which is parallel to electrical field in the waveguide) as an advantage. Waveguides may be directly bonded to the back facet of high performance AR-coated Fabry-Perot (FP) chip with taper type waveguide having mode expansion to match $LiNbO_3$ and FP chip propagation modes. Front end of such cavity use optical train based on Silica-on-Si PLC with asymmetric, high reflectivity waveguide grating, such as what is commercially available from Redfern Integrated Optics (RIO) Inc. of Santa Clara, Calif.

Such optical arrangement design results in optimum coupling efficiency and maximum possible integration of the active elements of the external cavity and produces very narrow linewidth. Hybrid integration with waveguide FM mirror allows to utilize low $V_\pi$ parameter of waveguide optical modulator and as a result, achieves high amplitude of frequency modulation and minimizes alignment requirements for packaging of such cavity.

Referring back to FIG. 1, external cavity in the system 100 is formed by the TE-mode 106 circulating between back facet with high reflectivity (HR) 102 coated $LiNbO_3$ tuning phase section 103 and front end of the integrated waveguide with asymmetric high reflectivity grating 117 while the active gain in such cavity is provided by the semiconductor InP-based multi quantum well (MQW) Fabry-Perot (FP) gain chip 115 with front and back facets coated with high performance AR coating 110 (Reflectivity, $R<510^{-4}$)

Laser beam is coupled to the FM section via an AR-coated coupling micro-lens 104 such as ball or aspheric types with prefer diameters of 0.3-0.7 mm which collimate laser beam and then enters $LiNbO_3$ crystal 103 which has a front surface with AR-coating and is tilted by 5-7 degree.

Laser beam with TE-polarization mode parallel to the Z-axis (optical) of a crystal enters the $LiNbO_3$ section, propagates along the crystal, and is reflected back from the HR mirror 102 (double pass propagation). During transit, the laser beam experiences a change in propagation delay in the cavity $\sim 2Lr_{33}V(t)$, where L is length of the crystal along the propagation direction, $r_{33}$ is the electro-optical coefficient of the $LiNbO_3$ crystal, $r_{33}$=31 pm/V at $\lambda$=1.55 µm and V(t) is an applied modulation voltage 1020 which applied to the electrodes 101 of $LiNbO_3$ crystal.

Figure 3:
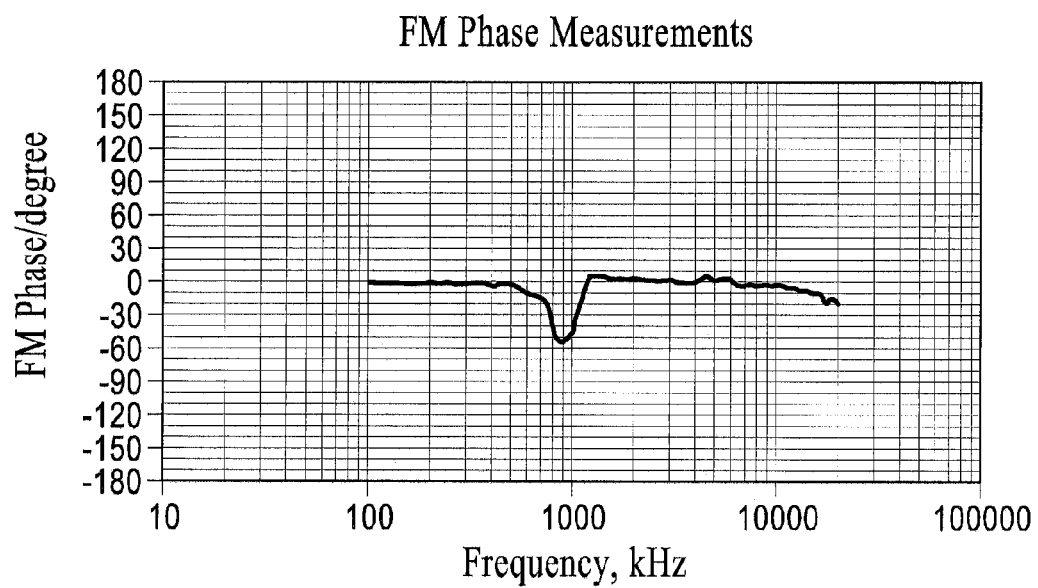
FIGS. 3-4 show measurement results of FM sensitivity and FM phase of FM-PLANEX type laser packaged with bulk LiNbO3 crystal.
Figure 4:
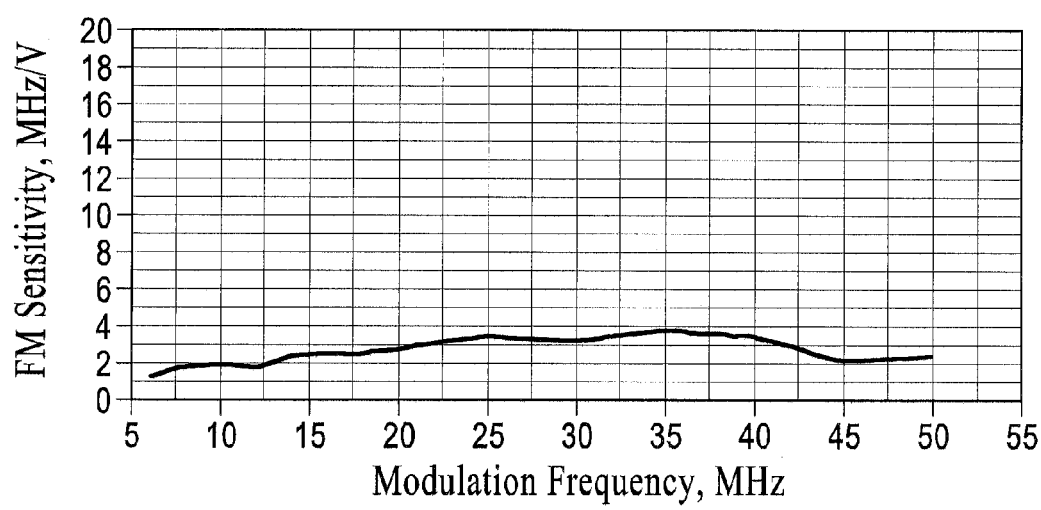
Figure 5:
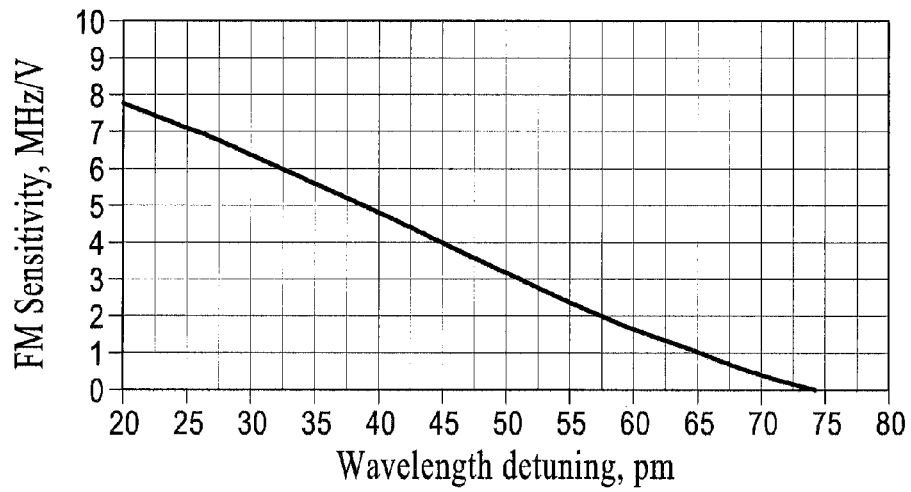
FIG. 5 shows modeling results on FM sensitivity, according to an embodiment of the present invention.

As described above, this invention uses as an advantage a known fact that semiconductor gain element acts as a polarizer which transmits (~100:1 ratio) only TE-mode 106 aligned to the direction of applied electrical field in the $LiNbO_3$ element. Such induced electrical field changes a refractive index in the $LiNbO_3$ element and correspondingly optical path of circulating TE-mode which results in a frequency modulation in the external cavity. Modulation of LiNbO3 chip allows to overcome thermal limitations associated with bias current modulation approach and achieves a wide and uniform phase modulation bandwidth. FIG. 3-4 show experimental data, and FIG. 5 shows modeling data characterizing performance of configurations described with respect to FIGS. 1 and 2. With reference to the configuration of ECL corresponding to FIG. 1, FM sensitivity, MHz/V in the double pass configuration depends on the wavelength detuning of a lasing.

Operation of the external cavity with frequency modulation follows the same approach as a known PLANEX-type ECL. First, FM modulation is disabled (external voltage signal V=0), then thermoelectric cooler (TEC) temperature and bias current corresponding high wavelength detuning and high optical power is enabled, and then as a next step, FM modulation is enabled by applying external voltage signal.

Figure 2:
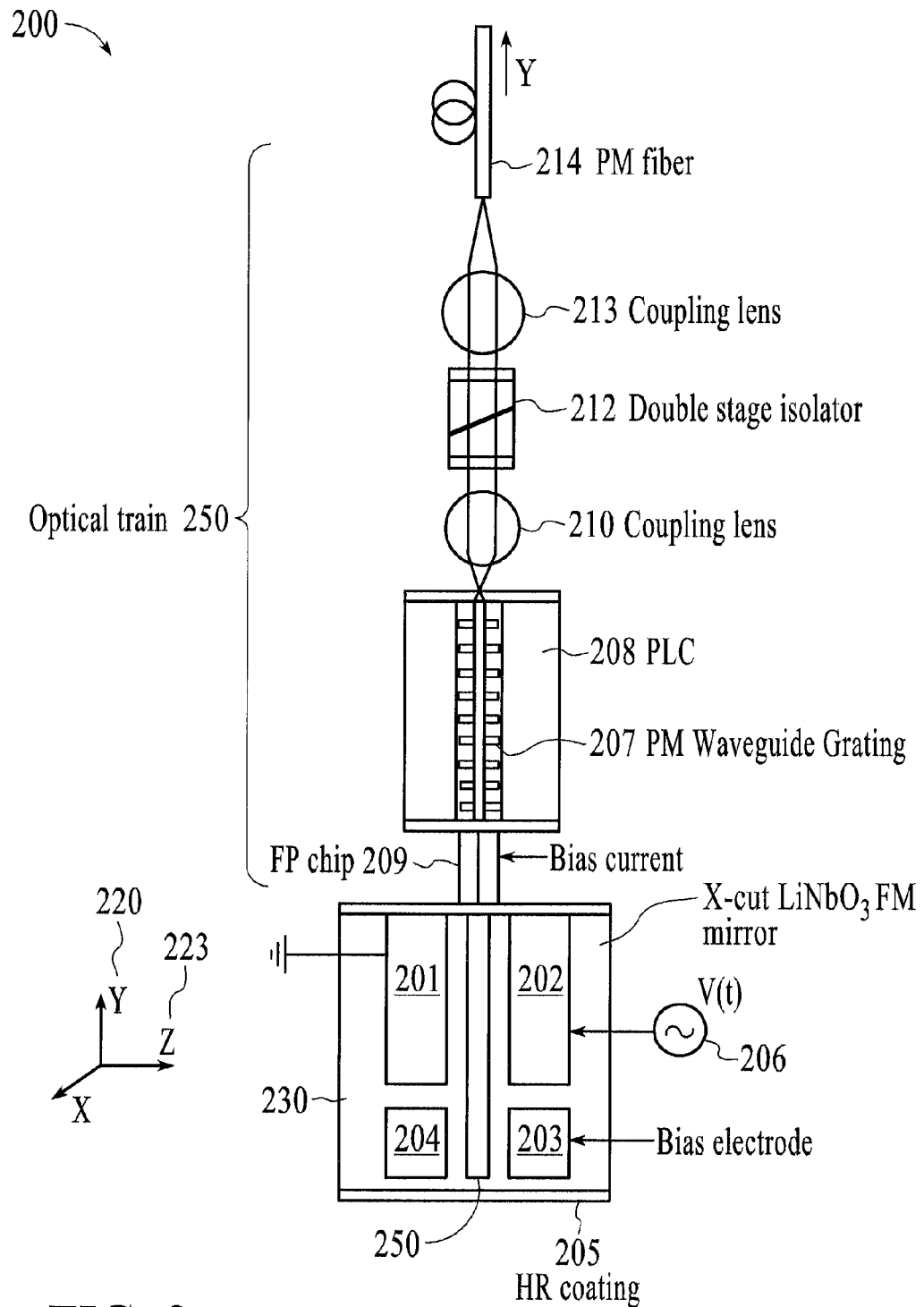
FIG. 2 illustrates a second embodiment of the invention which describes a semiconductor laser's external cavity's optical train along the propagation beam direction, and PLC front end.

FIG. 2 shows a second preferred embodiment of the present invention providing a low voltage and wide bandwidth FM semiconductor external cavity laser design and packaging with ultra-narrow linewidth and low frequency noise.

Operation of the external cavity 200 is similar to what is described with respect to FIG. 1 with the exception that FP chip waveguide 209 has a back taper for optimum coupling between $LiNbO_3$ and gain waveguides modes. Such back taper may differ from the front taper which provides low loss direct butt coupling between FP gain 209 and PLC grating waveguides 207.

External cavity of the system 200 shown in FIG. 2 is defined by circulating TE-polarization mode between high reflectivity mirror 205 deposited on the opposite end of $LiNbO_3$ waveguide and Bragg grating 207. $LiNbO_3$ has X-cut crystal 230 orientations with proton exchange or Ti-diffused waveguide 250 is located between two parallel electrode pairs, 201-202, and 203-204.

First electrode pair 201-202 is an AC-voltage electrodes pair and provides a frequency modulation, while the second electrode pair 203-204 is a DC-bias electrode pair which provides fine phase adjustment of the external cavity without inducing thermal effect.

Such electrodes are extended along the propagating direction Y 220 of laser beam and define a strong electrical field within the waveguide parallel to the propagating TE-polarization mode and Z-axis 223 of the crystal with the largest electro-optical coefficient $r_{33}$.

Such optical arrangement of the external cavity make possible hybrid integration of two back and front waveguides with AR-coated tapered FP gain element and results in operation with very low $V_\pi \sim$20-50 V for waveguide length $L_e$ of 2-5 mm and addresses the applications which require high FM amplitude. For an example, FM amplitude of 200 MHz will require 600 mW of the external voltage.

In a X-cut $LiNbO_3$ 230 electrical field in the waveguide 250 is defined by the distance between electrodes, and as a result, physical dimensions of the crystal, L and D, where L is a physical length and D is a physical width of the waveguide, can be made larger, such as L~1.2 $L_e$ and D~3-4 mm for convenience of the bonding and alignment crystal to the FP gain element.

To select proper operation conditions of the external cavity in system 200, it is necessary to operate on the high slope of grating profile. Currently this is achieved by properly choosing TEC temperature and operating bias current of the FP gain element. However, current adjustment usually follows by the thermal heating which reduces wavelength detuning effect since grating profile is displaced in the same direction.

Changing the bias electrodes of LiNbO$_3$ waveguide allows continuous wave (CW)-change of index of the refraction of propagation mode and as a result changes optical phase of the external cavity. Therefore, electrodes 203-204 provide DC-voltage to external phase section which allows optimizing the performance of the external cavity 200.

FIGS. 3-4 show experimental data characterizing performance of a packaged device having architecture similar to what is shown in FIG. 1. FIG. 3 shows measurement result of FM sensitivity and FIG. 4 shows measurement result of FM phase of FM-PLANEX package with bulk LiNbo3 crystal built and packaged according to embodiments of the present invention.

FIG. 5 shows modeling results on FM sensitivity, MHz/V vs. wavelength detuning of lasing wavelength in the Bragg grating.

Figure 6:
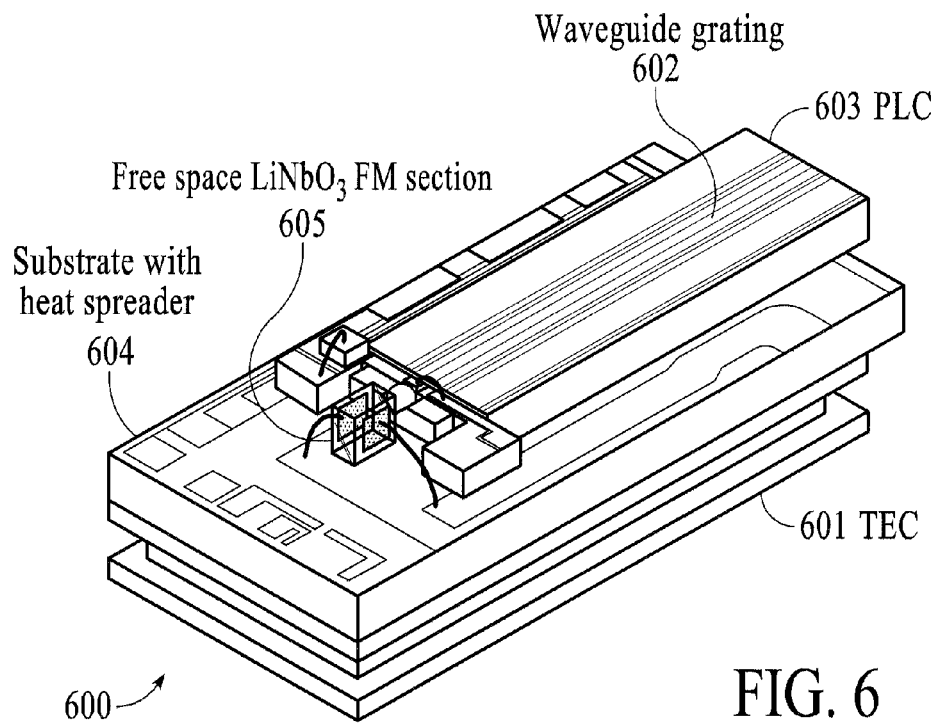
FIG. 6 illustrates the details of packaging assembly used for the configuration shown in FIG. 1.
Figure 7:
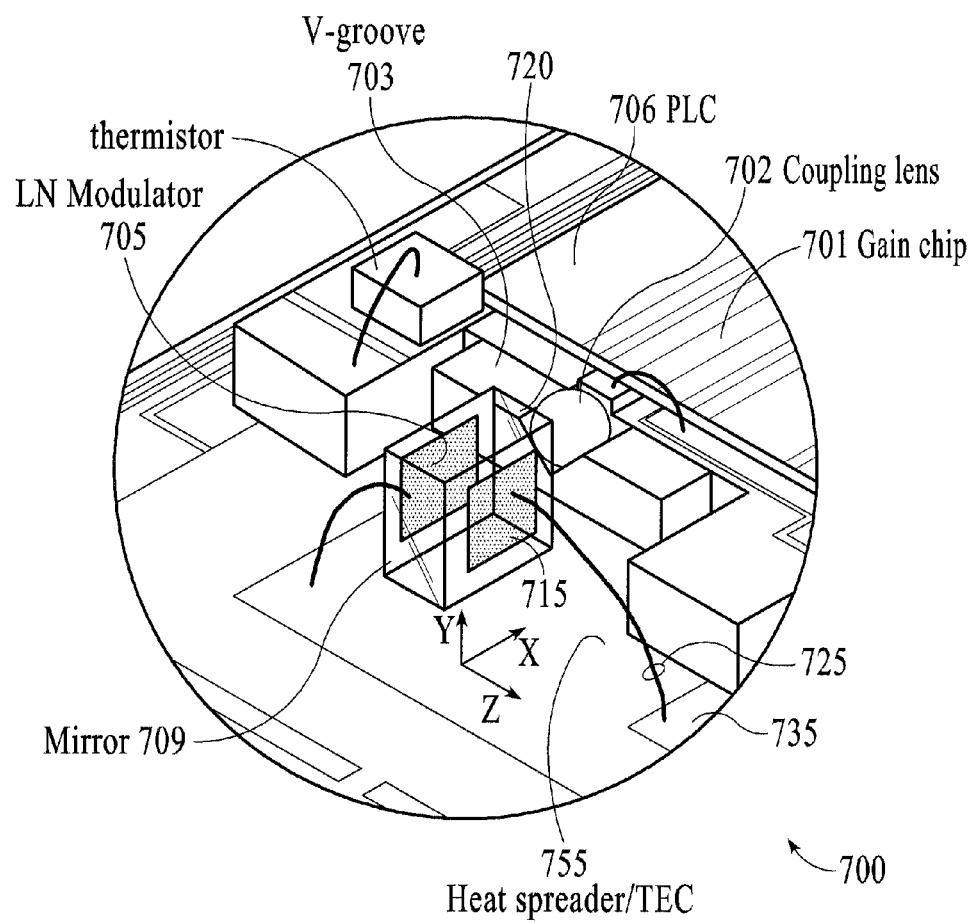
FIG. 7 shows the magnified view of back-end packaging assembly shown in FIG. 6.

A third embodiment of the present invention provides a hybrid external cavity FM laser assembled to be packaged in a standard form-factor package, such as a 14-pin butterfly package. FIG. 6-7 show two views of such an embodiment. In this embodiment, the "back facet" includes a free-space LiNbO$_3$ FM phase section attached to a heat spreader substrate, a semiconductor chip with a thermoelectric cooler (TEC), V-grove alignment fixture, a coupling micro-lens and AR-coated Fabry-Perot (FP) gain chip assembly. Using proper design to extend over the phase section, the TEC chip helps to stabilize modulation performance and alignment stability of LiNbO$_3$ FM phase section.

FIG. 6 (and the magnified backend 700 shown in FIG. 7) describe a 14-pin telecom packaging assembly 600 which includes extended semiconductor thermoelectric cooler (TEC) 601, substrate with heat spreader 604 and integration of the external cavity elements including Fabry-Perot (FP) gain chip 701, PLC waveguide grating 603, and free-space LiNbO$_3$ section 705 with coupling lens 702

External cavity of the invention is stabilized by TEC 601 which extends over length of the external cavity including free-space LiNbO$_3$ FM section 705 with electrode surfaces 715 connected to the package external pin 735 by the wires 725. Such external package pins used to supply an external voltage from the voltage source to the modulator section. LiNbO$_3$-FM section of the external cavity provides double pass configuration and has an HR coating 709 on one end and a tilted front AR-coated surface 720 to avoid back reflection. Such FM section is attached to heat spreader 755 with high temperature epoxy (an example of which is EPO-TEK 353ND). The FM section is coupled to the AR-coated FP chip with the help of the coupling micro-lens which could be spherical-type ball lens 702 or aspherical type. To minimize a coupling misalignments the coupling lens it mounted and positioned in the V-groove type sub-mount 703. During the packaging process LiNbO$_3$ section is aligned with FP waveguide gain chip 701 by dynamically adjusting position of the coupling lens 702 by maximizing FP optical power and then front end of the external cavity is assembled by using PLANEX-type packaging assembly and process described in US patent publication 2010/0303121, which is incorporated here as a reference.

Figure 8:
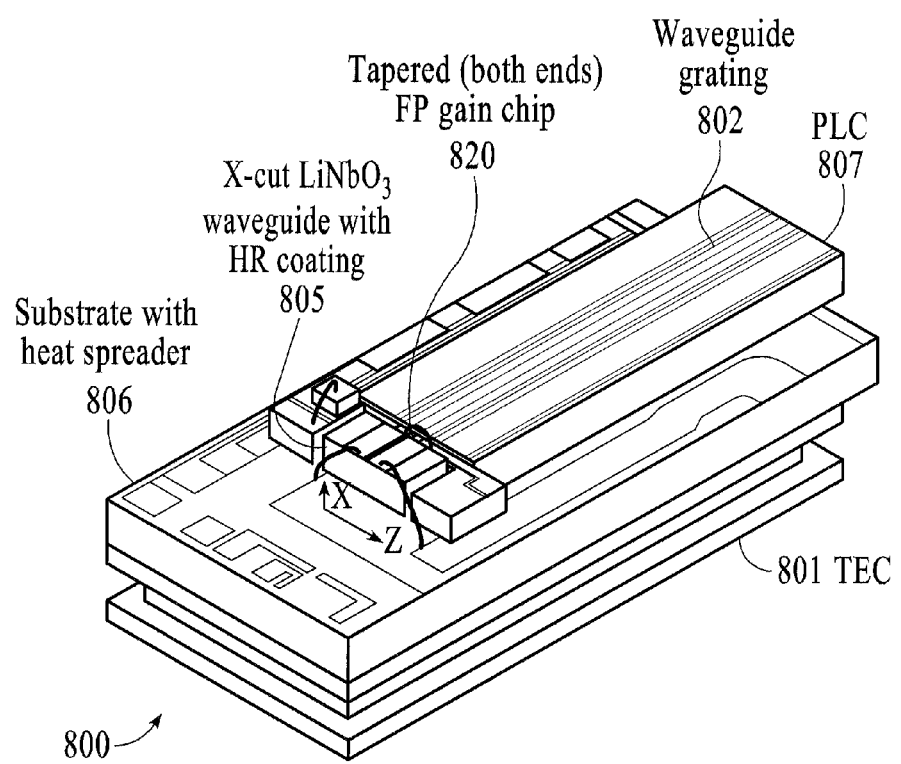
FIG. 8 shows a hybrid external cavity 14-pin butterfly package design with integrated LiNbo3 'back facet' waveguide.

A fourth embodiment of the present invention provides a hybrid external cavity FM laser assembled and packaged in the 14-pin butterfly package, as shown in FIG. 8. In this configuration, the back facet of the external cavity is formed by LiNbO$_3$ waveguide which is directly coupled to the FP chip via a tapered waveguide. LiNbO$_3$ FM phase section is attached to the heat spreader substrate, extended semiconductor TEC chip, and alignment fixtures with alignment marks. Extending over the phase section, the TEC chip helps to stabilize modulation performance and alignment stability of the LiNbO$_3$ FM phase section.

The 14-pin telecom packaging assembly 800 shown in FIG. 8 shows the extended semiconductor TEC chip 801. TEC chip 801 has substrate with heat spreader 806 and integrated optical elements. Such a hybrid integration platform includes AR-coated FP gain chip 820, PLC 807 including waveguide Bragg grating 802 and HR coated double pass waveguide LiNbO$_3$ X-cut FM section 805 on a sub-mount. LiNbO$_3$ waveguide is butt-coupled/bonded directly to the FP chip using the same packaging process as in the packaging of PLANEX front end external cavity laser.

To maximize coupling efficiency between FM section and FP chip, the FP waveguide has a tapered termination to provide mode matching between LiNbO$_3$ and FP waveguides. During the packaging process, waveguides of FM section and FP chip are dynamically aligned against each other by actively monitoring output optical power.

The descriptions above are intended to be illustrative, not limiting. Thus, it will be apparent to one skilled in the art that modifications may be made to the invention as described without departing from the scope of the claims set out below.

What is claimed is:

1. A semiconductor external cavity laser (ECL) with narrow line width, low noise and wide bandwidth uniform frequency modulation capabilities in both magnitude and phase, the semiconductor ECL comprising:
    a silica-on-silicon planar light wave circuit (PLC) comprising a semiconductor laser waveguide with embedded Bragg grating;
    a semiconductor gain chip butt coupled to the PLC, and
    a lithium niobate phase tuning element is optically coupled to the semiconductor gain chip;
    wherein anti-reflection (AR) coating cover a front facet of the lithium niobate phase tuning element, a front facet of the semiconductor gain chip that butt coupled to the PLC, and a front facet of the PLC; and high-reflection (HR) coating covers a back facet of the lithium niobate phase tuning element defining a back facet of an external cavity of the semiconductor ECL;
    wherein an alternating-current (AC)-voltage applied to electrodes of the lithium niobate phase tuning element generates an electric field, and the semiconductor gain chip acting as a polarizer allows to propagate in the external cavity only a transverse electric (TE) mode aligned perpendicular to a direction of the electric field in the lithium niobate phase tuning element; where a length of the lithium niobate phase tuning element is tailored to lasing characteristics of the PLC to achieve uniform frequency modulation response in phase and magnitude.

2. The semiconductor ECL of claim 1, wherein the lithium niobate phase tuning element utilizes a double-pass configuration.

3. The semiconductor ECL of claim 1, wherein the AC-voltage signal applied to the electrodes of the lithium niobate phase tuning element modulates a refractive index of the TE-mode propagating in the external cavity and produces uniform frequency modulation in both magnitude and phase.

4. The semiconductor ECL of claim 1, wherein the PLC, the semiconductor gain chip and the lithium niobate phase tuning element are assembled on an extended thermoelectric cooler (TEC) chip.

5. The semiconductor ECL of claim 4, wherein thermal effect of the semiconductor gain chip is isolated from the frequency modulation by the use of the TEC chip.

6. The semiconductor ECL of claim 4, wherein the semiconductor ECL on top of the TEC chip is enclosed in a standard 14-pin butterfly package.

7. The semiconductor ECL of claim 1, wherein the narrow linewidth of the ECL is below 10 kHz.

8. The semiconductor ECL of claim 1, wherein bandwidth of the uniform frequency modulation is up to 100 MHz.

9. The semiconductor ECL of claim 1, wherein the lithium niobate phase tuning element comprises bulk lithium niobate crystal.

10. The semiconductor ECL of claim 9, wherein the lithium niobate phase tuning element is coupled in free space with the semiconductor gain chip using an AR-coated coupling lens.

11. The semiconductor ECL of claim 10, wherein the coupling lens is mounted on a V-grooved submount for proper alignment in free space, thereby increasing optical coupling efficiency between the semiconductor gain chip and the lithium niobate phase tuning element.

12. The semiconductor ECL of claim 1, wherein the lithium niobate phase tuning element comprises:
   a lithium niobate waveguide with X-cut crystal orientation, and
   the electrodes of the lithium niobate phase tuning element comprise a first pair and a second pair of electrodes on both sides of the lithium niobate waveguide.

13. The semiconductor ECL of claim 12, wherein the first pair of electrodes is used for frequency modulation using AC voltage, and a second pair of electrodes is used for fine adjustment of direct current (DC) voltage used for phase control of the TE mode propagating in the external cavity independent of a bias current applied to the semiconductor gain chip.

14. The semiconductor ECL of claim 12, wherein the lithium niobate phase tuning element is butt coupled with the semiconductor gain chip.

15. The semiconductor ECL of claim 14, wherein the semiconductor gain chip has a tapered termination at its AR-coated back facet for mode matching with the lithium niobate waveguide, thereby increasing coupling efficiency between the semiconductor gain chip and the lithium niobate phase tuning element.

16. The semiconductor ECL of claim 15, wherein 20-50V AC voltage is used for a lithium niobate waveguide length of 2-5 mm.

* * * * *